(12) United States Patent
Lai

(10) Patent No.: US 7,595,514 B2
(45) Date of Patent: Sep. 29, 2009

(54) NITRIDE-BASED SEMICONDUCTOR LIGHT EMITTING DEVICE AND METHOD FOR FABRICATING SAME

(75) Inventor: Chih-Ming Lai, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 12/102,617

(22) Filed: Apr. 14, 2008

(65) Prior Publication Data

US 2009/0020781 A1 Jan. 22, 2009

(30) Foreign Application Priority Data

Jul. 19, 2007 (CN) .................. 2007 1 0201125

(51) Int. Cl.
*H01L 33/00* (2006.01)
(52) U.S. Cl. ................. 257/99; 257/103; 257/E33.064; 257/E33.066
(58) Field of Classification Search ............ 257/79, 257/99, 103, E33.064, E33.066
See application file for complete search history.

(56) References Cited

U.S. PATENT DOCUMENTS 6,441,403 B1 * 8/2002 Chang et al. .................. 257/94

* cited by examiner

*Primary Examiner*—Thien F Tran
(74) *Attorney, Agent, or Firm*—Wei Te Chung

(57) ABSTRACT

An exemplary nitride-based semiconductor light emitting device includes a substrate, a nitride-based multi-layered structure epitaxially formed on the substrate, a first-type electrode and a second-type electrode. The multi-layered structure includes a first-type layer, an active layer, and a second-type layer. The multi-layered structure has a developed mesa structure which at least includes the second-type layer and the active layer and whereby the first-type layer is partially exposed to form an exposed portion. The mesa structure has a roughened top surface and a plurality of roughened side surfaces adjoining the top surface. A crystal growth orientation of the multi-layered structure intersects with <0001> crystal orientation thereof. The first-type electrode and the second-type electrode respectively come into ohmic contact with the first-type layer and the second-type layer.

8 Claims, 5 Drawing Sheets

NITRIDE-BASED SEMICONDUCTOR LIGHT EMITTING DEVICE AND METHOD FOR FABRICATING SAME

BACKGROUND

1. Technical Field

The present invention generally relates to solid state light emitting devices and, particularly, to a nitride-based semiconductor light emitting device with relatively low cost and high light extraction efficiency and methods for fabricating the same.

2. Description of Related Art

Nowadays, nitride-based semiconductor light emitting devices such as gallium nitride LEDs (i.e., light emitting diodes) have the advantages of low-power consumption and long life-span, etc, and thus are widely used for display, backlight, outdoor illumination, automobile illumination, etc. However, in order to achieve high luminous brightness, an improvement of light extraction efficiency of the conventional nitride-based LEDs is required.

Kao et al. have published a paper on IEEE photonics technology letters, vol. 19, No. 11, page 849-851 (June, 2007) entitled "light-output enhancement of nano-roughened GaN laser lift-off light-emitting diodes formed by ICP dry etching", the disclosure of which is fully incorporated herein by reference. Kao et al. have proposed an approach for the improvement of the light extraction efficiency of the GaN LED, by way of roughening a light-emitting region of the GaN LED via an ICP-RIE (i.e., inductively coupled plasma-reactive ion etching) dry etching. In particular, a GaN-based layer structure is epitaxially grown on a c-face sapphire substrate, the GaN-based layer structure then is placed into a vacuum chamber which is fed with chlorine and argon for ICP-RIE dry etching. Consequently, a light-emitting region of the GaN-based layer structure is given a nano-roughened surface which facilitates the improvement of light extraction efficiency of the GaN LED.

However, the use of the c-face sapphire substrate would force the epitaxial growth of the GaN-based layer structure oriented along a c-axis <0001> crystal orientation. As a result, the surface atoms of the resultant GaN-based layer structure are entirely gallium metal atoms. Such configuration of the surface atoms results in the GaN-based layer structure exhibits an extremely strong polarity defect. Such polarity defect would cause the following issues: (1) a quantum well structure in the GaN-based layer structure which is oriented along the c-axis <0001> crystal orientation, would encounter a significantly strong quantum-confined stark effect (QCSE), so that an internal quantum efficiency of the GaN LED is lowered and thus the light extraction efficiency is degraded. (2) in order to roughen the surface of the light-emitting region, a low cost wet etching process is helpless, instead, a relatively high cost dry etching process with strong etching capability (e.g., ICP-RIE etching process) is absolutely needed. Unfortunately, the dry etching process is difficult to roughen sidewalls of the GaN-based layer structure for further improvement of light extraction efficiency of the GaN LED due to an inherent selective etching characteristic thereof.

Therefore, what is needed is a nitride-based semiconductor light emitting device with high extraction efficiency and relatively low cost and methods for fabricating the same.

SUMMARY

A nitride-based semiconductor light emitting device, in accordance with a present embodiment, is provided. The nitride-based semiconductor light emitting device includes: a substrate, a nitride-based multi-layered structure epitaxially formed on the substrate, a first-type electrode and a second-type electrode. The nitride-based multi-layered structure has a crystal growth orientation intersecting with <0001> crystal orientation thereof and includes a first-type layer, an active layer and a second-type layer. The first-type layer, the active layer and the second-type layer are arranged along a direction away from the substrate, in the order written. The second-type layer and the active layer cooperatively form a developed mesa structure, and the first-type layer has an exposed portion. The mesa structure has a top surface facing away from the substrate and a plurality of side surfaces adjoining the top surface. The top surface and the side surfaces are roughened surfaces. The first-type electrode and the second-type electrode are respectively formed on the exposed portion and the top surface of the mesa structure so as to respectively bring into ohmic contact with first-type layer and the second-type layer.

A method for fabricating a nitride-based semiconductor light emitting device, in accordance with another present embodiment, is provided. The method includes: (a) providing a substrate; (b) epitaxially growing a nitride-based multi-layered structure on the substrate, a crystal growth orientation of the multi-layered structure intersecting with <0001> crystal orientation thereof, the multi-layered structure including a first-type layer, an active layer and a second-type layer arranged along a direction away from the substrate, in the order written; (c) patterning the multi-layered structure to form a mesa structure which at least include the second-type layer and the active layer and whereby the first-type layer is partially exposed to form an exposed portion, the mesa structure having a top surface facing away from the substrate and a plurality of side surfaces adjoining the top surface; (d) forming a first-type electrode and a second-type electrode respectively on the exposed portion and the top surface of the mesa structure so as to respectively come into ohmic contact with first-type layer and the second-type layer; and (e) wet etching the patterned multi-layered structure so as to roughen the top surface and the side surfaces of the mesa structure.

Since the present nitride-based multi-layered structure have a crystal growth orientation intersecting (i.e., generally non-parallel) with <0001> crystal orientation thereof, surface atoms of the mesa structure are not entirely metal atoms, also with the existence of nitrogen atoms, thus the conventional extremely strong polarity defect in the prior art can be minimized or even eliminated. Therefore, a wet etching process now is qualified to carry out a roughening process for the mesa structure to improve the light extraction efficiency of the present nitride-based semiconductor light emitting device. Furthermore, the wet etching process generally has a relatively lower cost than the dry etching process, rendering low cost for the fabrication of the present nitride-based semiconductor light emitting device.

Other advantages and novel features will become more apparent from the following detailed description of embodiments, when taken in conjunction with the accompanying drawings.

BRIEF DESCRIPTION OF THE DRAWINGS

Many aspects of the present nitride-based semiconductor light emitting device and the present method for fabricating a nitride-based semiconductor light emitting device can be better understood with reference to the following drawings. The components in the drawings are not necessarily drawn to scale, the emphasis instead being placed upon clearly illustrating the principles of the present nitride-based semiconductor light emitting device and the present method. Moreover, in the drawings, like reference numerals designate corresponding parts throughout the several views.

The exemplifications set out herein illustrate various preferred embodiments, in various forms, and such exemplifications are not to be construed as limiting the scope of the present nitride-based semiconductor light emitting device and the present method in any manner.

DETAILED DESCRIPTION

Figure 1:
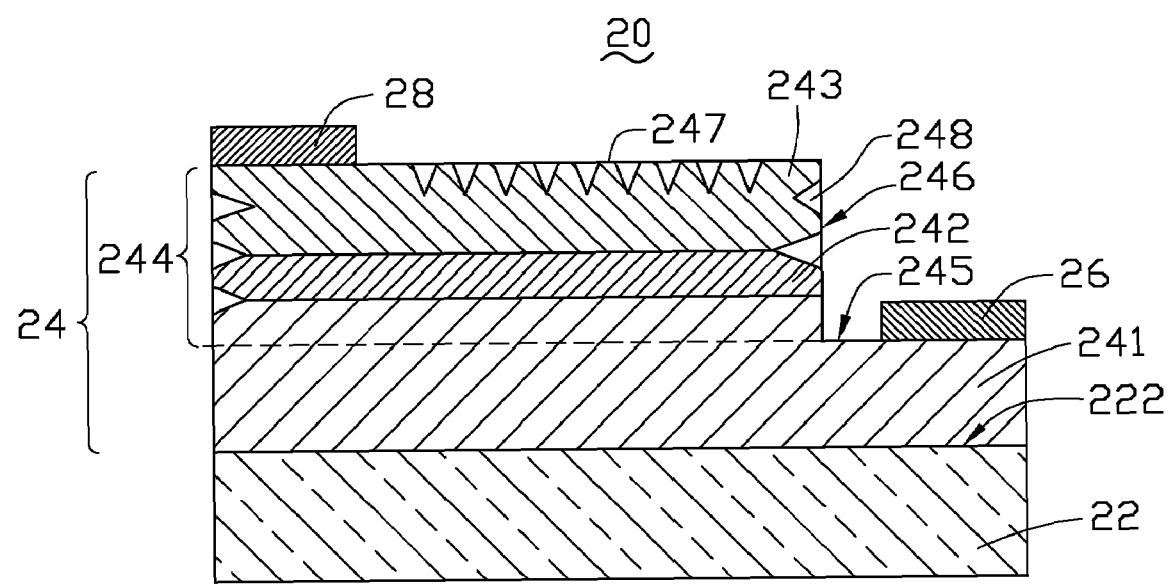
FIG. 1 is a schematic, cross-sectional view of a nitride-base semiconductor light emitting device, in accordance with a present embodiment.

Referring to FIG. 1, a nitride-based semiconductor light emitting device 20 such as a gallium nitride light emitting diode (GaN LED), in accordance with a present embodiment, is provided. The nitride-based semiconductor light emitting device 20 includes: a substrate 22, a nitride-based multi-layered structure 24 epitaxially formed on the substrate 22, an N-type electrode 26 and a P-type electrode 28.

The substrate 22 beneficially is a single crystal plate and can be made from a material of sapphire, silicon carbide (SiC), silicon (Si), gallium arsenide (GaAs), lithium aluminate (LiAlO2), magnesium oxide (MgO), zinc oxide (ZnO), GaN, aluminum nitride (AlN) or indium nitride (InN), etc. The substrate 22 has a crystal face 222 facilitating the epitaxial growth of the nitride-based multi-layered structure 24 thereon. A crystal orientation of the crystal face 222 matches with a crystal growth orientation of the multi-layered structure 24.

The multi-layered structure 24 includes an N-type layer 241, an active layer 242 and a P-type layer 243 arranged along a direction away from substrate 22, in the order written. That is, the active layer 242 is sandwiched between the N-type layer 241 and the P-type layer 243. The N-type layer 241 has an opposite conductive type with respect to the P-type layer 243. The N-type layer 241, the active layer 242 and the P-type layer 243 individually can be a single layer structure or a multi-layered structure, and suitably made from group III-nitride compound materials. The group III element can be aluminum (Al), gallium (Ga), indium (In) and so on. For the illustration purpose, the N-type layer 241, the active layer 242 and the P-type layer 243 respectively are an N-type GaN layer, an InGaN layer and a P-type GaN layer.

The multi-layered structure 24 has a crystal growth orientation intersecting with <0001> crystal orientation thereof. That is, crystal growth orientations of the N-type layer 241, the active layer 242 and the P-type layer 243 respectively are intersected with respective <0001> crystal orientations. Beneficially, the multi-layered structure 24 has a crystal growth orientation such as <11$\bar{2}$0> crystal orientation or <10$\bar{1}$0> crystal orientation substantially perpendicular to <0001> crystal orientation thereof.

The multi-layered structure 24 has a developed mesa structure 244 and whereby the N-type layer 241 is partially exposed to form an exposed portion 245 at a side facing away from the substrate 22. The mesa structure 244 terminates at a plane as denoted by the dash line in FIG. 1. The mesa structure 244 includes but not limited to the P-type layer 243, the active layer 242 and a top portion of the N-type layer 241. The mesa structure 244 has a top surface 247 and a plurality of side surfaces 246 adjoining the top surface 247. The side surfaces 246 are located between the top surface 247 and the exposed portion 245. The top surface 247 and the side surfaces 246 are roughened surfaces and include a plurality of recesses 248 formed thereon, as illustrated in the present embodiment. Rough microstructure can help transmit the light emitted from the active layer 242 to emit from the side surfaces 246, so as to change light field distribution of the nitride-based semiconductor light emitting device 20, namely the divergence angle of the light emitted form the nitride-based semiconductor light emitting device 20.

The N-type electrode 26 is formed on the exposed portion 245 so as to electrically connect (e.g., ohmic contact) with the N-type layer 241. The N-type electrode 26 usually includes at least one metallic layer which is ohmic contacted with the N-type layer 241.

The P-type electrode 28 is formed on the top surface 247 of the mesa structure 244 so as to electrically connect (e.g., ohmic contact) with the P-type layer 243. The P-type electrode 28 can be a single metallic layer or a multi-layered structure essentially includes a metallic layer and a transparent conductive film.

Referring to FIGS. 2 through 6, a method for fabricating the nitride-based semiconductor light emitting device 20 will be described in detail, with reference to the accompanying drawings.

Figure 2:
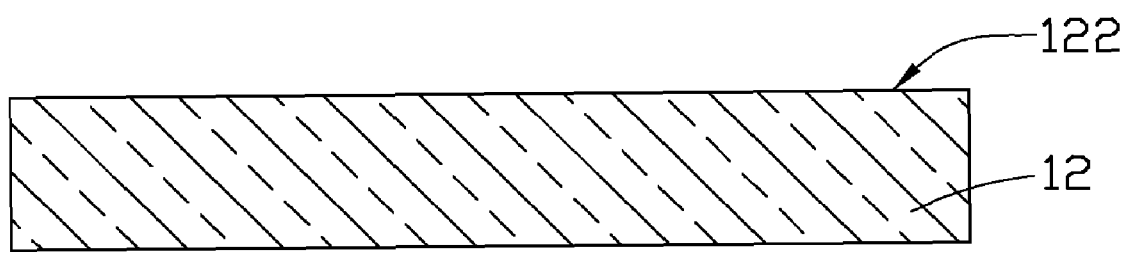
FIG. 2 is a schematic, cross-sectional view of a single crystal plate, in accordance with a present embodiment.

As illustrated in FIG. 2, a substrate 12 is provided. The substrate 12 is a single crystal plate and can be made from sapphire, SiC, Si, GaAs, LiAlO2, MgO, ZnO, GaN, AlN, or InN, etc. The single crystal substrate 12 has a crystal face 122 facilitating a nitride-based multi-layered structure epitaxially grown thereon. A crystal orientation of the crystal face 122 matches with a crystal growth orientation of a multi-layered structure 14 epitaxially grown on the substrate 12. The crystal face 122 can be a non-polar face or semi-polar face. In particular, the non-polar face is a type of crystal face having a crystal orientation substantially perpendicular to that of the (0001) crystal face 122. The semi-polar is a type of crystal face having a crystal orientation obliquely intersected with that of the (0001) crystal face 122.

Figure 3:
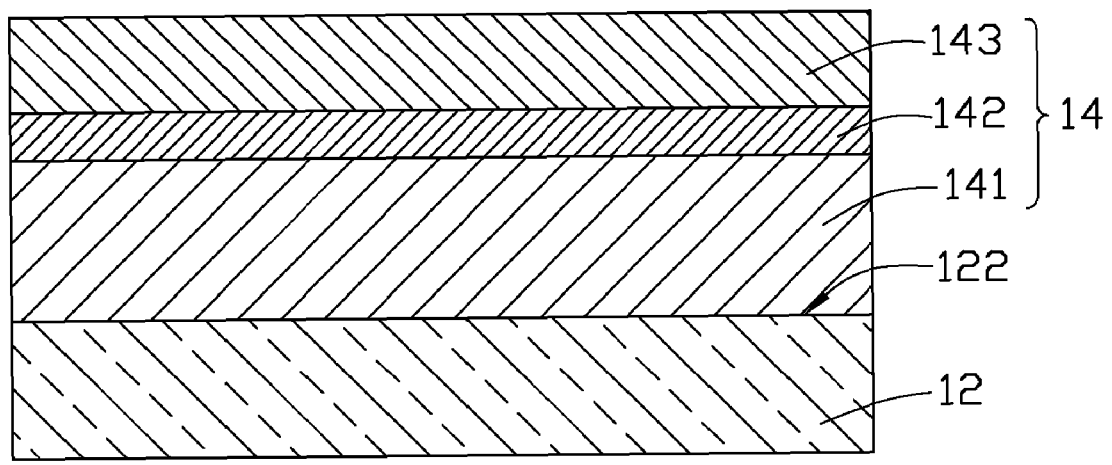
FIG. 3 shows a nitride-based multi-layered structure epitaxially formed on the single crystal plate of FIG. 2.

Referring to FIG. 3, a nitride-based multi-layered structure 14 is epitaxially formed on the crystal face 122 of the single crystal substrate 12. The nitride-based multi-layered structure 14 includes an N-type layer 141, an active layer 142 and a P-type layer 143 arranged along a direction away from the single crystal substrate 12, in the order written. That is, the active layer 142 is sandwiched between the N-type layer 141 and the P-type layer 143. The N-type layer 141 and the P-type layer 143 have opposite conductive types with respect to each other. In the illustrated embodiment, the N-type layer 141, the active layer 142 and the P-type layer 143 are suitably made from group III-nitride compound materials. For the purpose of illustration, the N-type layer 141, the active layer 142 and the P-type layer 143 respectively are an N-type GaN layer, an InGaN layer and a P-type GaN layer.

The nitride-based multi-layered structure 14 has a crystal growth orientation such as <11$\bar{2}$0> crystal orientation or <10$\bar{1}$0> crystal orientation which intersects with <0001> crystal orientation thereof. As such, surface atoms of the N-type layer 141, the active layer 142 and the P-type layer 143 are not entirely metal atoms, also with the existence of nitrogen atoms. Due to the existence of nitrogen atoms, the conventional extremely strong polarity defect in the prior art can be effectively minimized or even eliminated. Accordingly, a wet etching process is now feasible for roughening the surfaces of the nitride-based multi-layered structure 14.

Figure 4:
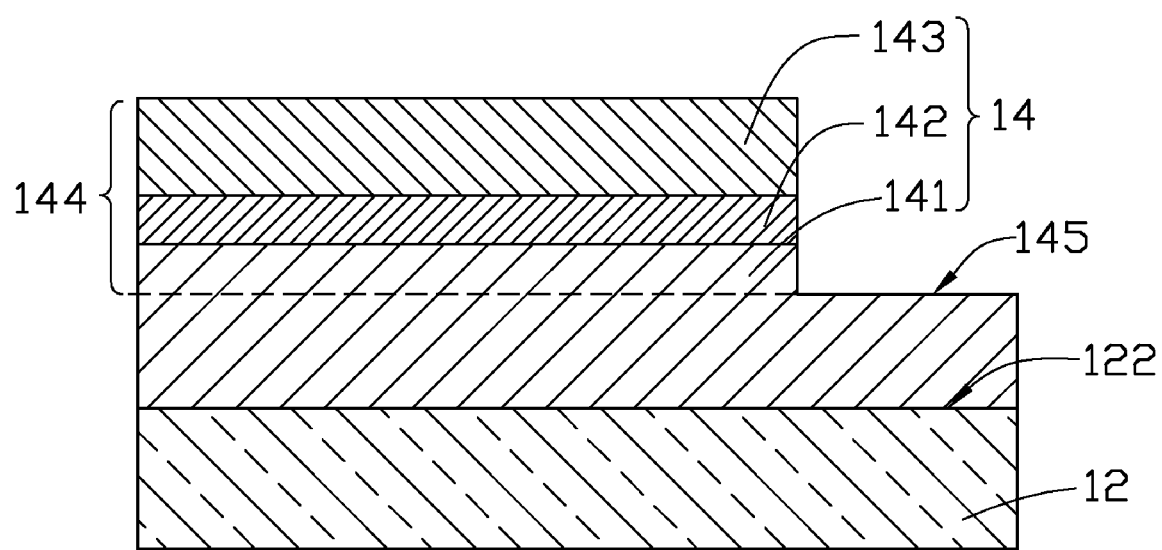
FIG. 4 shows the multi-layered structure of FIG. 3 being patterned to form a mesa structure.

Referring to FIG. 4, the nitride-based multi-layered structure 14 is patterned/developed to form a mesa structure 144 so that a top surface (not labeled) of the N-type layer 141 is partially exposed to form an exposed portion 145. In particular, a hard mask layer (not shown) for example, a patterned nickel layer is firstly disposed on the nitride-based multi-layered structure 14. A dry etching such as RIE etching process is then implemented to partially remove the P-type layer 143 and the active layer 142 so that the top surface of the N-type layer 141 is partially exposed, and thus an exposed portion 145 is consequently formed. The hard mask layer subsequently is removed so that the mesa structure 144 is formed on the nitride-based multi-layered structure 14. The mesa structure 144 at least includes but not limited to the P-type layer 143, the active layer 142 and a top portion of the N-type layer 141. The mesa structure 144 terminates at a plane as denoted by the dashed line of FIG. 4. The mesa structure 144 includes a top surface 147 facing away from the substrate 12 and a plurality of side surfaces 146 adjoining the top surface 147. The side surfaces 146 are located between the top surface 147 and the exposed portion 145.

Figure 5:
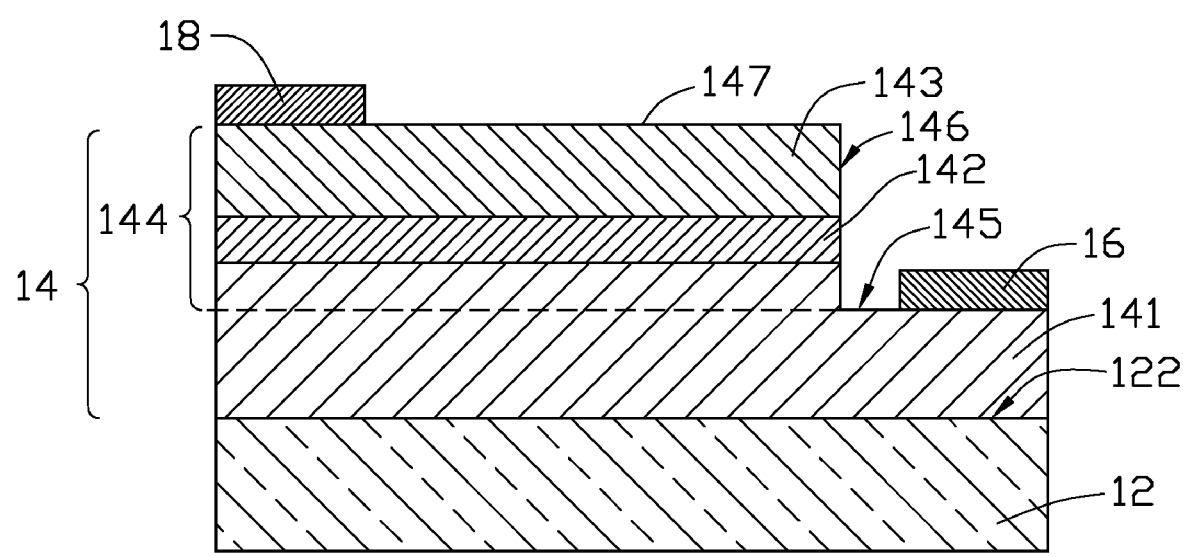
FIG. 5 shows an N-type electrode and a P-type electrode formed on the patterned multi-layered structure of FIG. 4.

Referring to FIG. 5, an N-type electrode 16 and a P-type electrode 18 are respectively formed on and electrically ohmic contacted with the N-type layer 141 and the P-type layer 143. In particular, the N-type electrode 16 is formed on the exposed portion 145 of the N-type layer 141, and the P-type electrode 18 is formed on the top surface 147 of the mesa structure 144.

After the formation of the N-type electrode 16 and the P-type electrode 18, a wet etching process is carried out for roughening the top surface 147 and the side surfaces 146 of the mesa structure 144. As a result, a nitride-based semiconductor light emitting device as illustrated in FIG. 1 is fabricated. In particular, in order to perform the wet etching process, the patterned multi-layered structure 14 is immersed into an acid etching solution, such as a mixture solution containing phosphoric acid and sulfuric acid. A mol ratio of the phosphoric acid to the sulfuric acid is 1:1 with an etching temperature above 150 degrees Celsius. It is indicated that, the wet etching can only occur at one of the top surfaces and the side surfaces by protecting the others from etching. The etching rate, etching selectivity and roughness of an etched surface can be controlled by adjusting the etching temperature, the composition or concentration of the etching solution.

Advantageously, in order to accelerate the etching rate of the wet etching process, an electromagnetic wave having a predetermined energy can be employed to irradiate etching areas such as the side surfaces 146. The energy of the electromagnetic wave generally is higher than an energy gap of the etched nitride-based semiconductor material so that the nitride-based semiconductor material can absorb the energy of the electromagnetic wave. It is understood that, the irradiation of the electromagnetic wave not only can accelerate the etching rate, can also be used to decrease the etching temperature.

It is indicated that the chemical etching solution is not limited to an acid etching solution, but can also use other etching solutions such as an alkaline etching solution containing potassium hydroxide (KOH), as long as the same or similar etching effect is achieved.

In addition, a person skilled in the art can perform various changes within the spirit of the present embodiment, such as changing the material of the substrates 12,22, the structure of the nitride-based multi-layered structure 24, the compositions of the etching solution, and/or the etching temperature, etc.

It is believed that the present embodiments and their advantages will be understood from the foregoing description and it will be apparent that various changes may be made thereto without departing from the spirit and scope of the invention or sacrificing all of its material advantages, the examples hereinbefore described merely being preferred or exemplary embodiments of the present invention.

What is claimed is:

1. A nitride-based semiconductor light emitting device, comprising:
   a substrate;
   a nitride-based multi-layered structure epitaxially formed on the substrate, the multi-layered structure including a first-type layer, an active layer and a second-type layer arranged along a direction away from the substrate in the order written, the second-type layer and the active layer cooperatively forming a developed mesa structure, the first-type layer having an exposed portion, the mesa structure having a top surface facing away from the substrate and a plurality of side surfaces adjoining the top surface, wherein a crystal growth orientation of the multi-layered structure intersects with <0001> crystal orientation thereof, and the top surface and the side surfaces are roughened surfaces;
   a first-type electrode formed on the exposed portion and brought into ohmic contact with the first-type layer; and
   a second-type electrode formed on the top surface and brought into ohmic contact with the second-type layer.

2. The nitride-based semiconductor light emitting device of claim 1, wherein the substrate is a single crystal plate, the single crystal plate has a crystal face on which the multi-layered structure is epitaxially formed, and the crystal growth orientation matches with a crystal orientation of the crystal face.

3. The nitride-based semiconductor light emitting device of claim 2, wherein the single crystal plate is made from a material selected from the group consisting of sapphire, silicon carbide, silicon, gallium arsenide, lithium aluminate, magnesium oxide, zinc oxide, gallium nitride, aluminum nitride and indium nitride.

4. The nitride-based semiconductor light emitting device of claim 1, wherein the first-type layer, the active layer and the second-type layer are made from group III-nitride compound materials.

5. The nitride-based semiconductor light emitting device of claim 1, wherein surface atoms of the multi-layered structure comprises metal atoms and nitrogen atoms.

6. The nitride-based semiconductor light emitting device of claim 1, wherein the crystal growth orientation of the multi-layered structure is substantially perpendicular to the <0001> crystal orientation.

7. The nitride-based semiconductor light emitting device of claim 1, wherein the roughened surfaces are formed using a wet etching process.

8. The nitride-based semiconductor light emitting device of claim 1, wherein the top surface and the side surfaces have a plurality of recesses formed thereon.

* * * * *